United States Patent
Reid

(10) Patent No.: US 10,931,242 B2
(45) Date of Patent: Feb. 23, 2021

(54) ERROR AMPLIFIER

(71) Applicant: Reid Acoustic Designs Ltd., London (GB)

(72) Inventor: Laurence Reid, London (GB)

(73) Assignee: Reid Acoustic Designs Ltd., London (GB)

( * ) Notice: Subject to any disclaimer, the term of this patent is extended or adjusted under 35 U.S.C. 154(b) by 0 days.

(21) Appl. No.: 16/637,240

(22) PCT Filed: Aug. 7, 2018

(86) PCT No.: PCT/GB2018/052254
§ 371 (c)(1),
(2) Date: Feb. 6, 2020

(87) PCT Pub. No.: WO2019/030518
PCT Pub. Date: Feb. 14, 2019

(65) Prior Publication Data
US 2020/0235707 A1 Jul. 23, 2020

(30) Foreign Application Priority Data

Aug. 7, 2017 (GB) .................................. 1712647.5

(51) Int. Cl.
*H03F 1/32* (2006.01)
*H03H 11/12* (2006.01)

(52) U.S. Cl.
CPC ....... *H03F 1/3247* (2013.01); *H03H 11/1204* (2013.01); *H03F 1/3264* (2013.01); *H03F 2200/03* (2013.01); *H03F 2200/144* (2013.01)

(58) Field of Classification Search
CPC combination set(s) only.
See application file for complete search history.

(56) References Cited

U.S. PATENT DOCUMENTS 5,635,871 A 6/1997 Cavigelli
6,529,068 B1 3/2003 Nicollini et al.
(Continued)

FOREIGN PATENT DOCUMENTS

| DE | 19838765 A1 | 5/2000 |
|---|---|---|
| EP | 1879290 A2 | 1/2008 |
| WO | WO-2014/037017 A1 | 3/2014 |

OTHER PUBLICATIONS

United Kingdom Combined Search and Examination Report issued in GB Application No. GB1712647.5, dated Jan. 30, 2018, 3 pages.
(Continued)

*Primary Examiner* — Junpeng Chen
(74) *Attorney, Agent, or Firm* — Wilmer Cutler Pickering Hale and Dorr LLP

(57) ABSTRACT

An error amplifier for a pulse width modulation circuit is described. The amplifier includes an operational amplifier configured as an integrator and a feedback loop coupled between a signal output of the operational amplifier and an inverting input of the operational amplifier. The feedback loop comprises a feedback capacitor coupled to the signal output, a feedback resistor coupled to the feedback capacitor, and an integrator resistor coupled to the feedback resistor and the inverting input of the operational amplifier. A junction between the feedback resistor and the integrator resistor is configured to receive an input signal and a junction between the feedback capacitor and the feedback resistor is configured to receive a feedback signal from the pulse width modulation circuit.

15 Claims, 3 Drawing Sheets

(56) References Cited

U.S. PATENT DOCUMENTS

| | | | |
|---|---|---|---|
| 2002/0101279 A1 | 8/2002 | Greitschus et al. | |
| 2005/0162223 A1* | 7/2005 | Maejima | H03F 3/2171 330/10 |
| 2007/0247219 A1* | 10/2007 | Rodriguez | H03F 3/211 330/10 |
| 2008/0024213 A1* | 1/2008 | Magrath | H03F 3/3022 330/96 |
| 2015/0171793 A1 | 6/2015 | Regier | |
| 2015/0236646 A1* | 8/2015 | Wehmeier | H03F 3/217 332/135 |

OTHER PUBLICATIONS

European Communication Pursuant to Article 94(3) EPC issued in European Patent Application No. 18769416.1, dated Nov. 13, 2020, 4 pages.

* cited by examiner

US 10,931,242 B2

ERROR AMPLIFIER

CROSS-REFERENCE TO RELATED APPLICATIONS

This application is a 371 national phase of PCT/GB2018/052254, filed Aug. 7, 2018, which claims the benefit and priority of United Kingdom Patent Application No. 1712647.5, filed Aug. 7, 2017, each of which is hereby incorporated by reference in its entirety as if fully set forth herein.

The invention relates to an error amplifier. In particular, the invention relates to an error amplifier for a pulse width modulation circuit and a pulse width modulation circuit comprising the same.

BACKGROUND

FIG. 1 illustrates an example of an audio pulse width modulation (PWM) amplifier 2. An audio PWM amplifier is a switching amplifier with a switching frequency in excess of 2 times higher and in the region of 20 to 40 times higher than the highest audio frequency of the audio signal. The amplifier 2 includes an error amplifier which is arranged to compare a switched output of the amplifier with an audio input signal to ensure the output is a linearly scaled version of the input signal and to compensate for variations in the bus output voltage with respect to the input voltage, due to finite and varying load configurations, and variations in bus voltage. In the figure, an error amplifier is arranged which includes an operational amplifier, or op-amp, 4 configured as an integrator with a feedforward capacitor 6. The operational amplifier 4 receives at its inverting input an audio signal via an input resistor 8 and an output signal from a switching stage of the amplifier via a feedback resistor 10. An audio signal output of the operational amplifier 4 is coupled to a comparator 12 which combines the audio signal output with a triangular or saw-tooth modulation waveform generated by the signal generator 14.

The amplifier includes a power stage 16. The power stage 16 includes a gate driver or switching controller 18 which outputs a signal comprising square pulses of fixed amplitude with a varying width and separation. It will be appreciated that the gate driver 18 generates a signal and a level shifted and inverted version of the same separated by a protective delay or dead time. The gate driver 18 receives a modulated signal from the comparator 12. The low-frequency portion of the received modulated signal is the audio signal to be amplified and the high-frequency portion is the triangular or saw-tooth waveform which serves to create a digital signal (i.e. a signal which switches between two distinct, pre-defined bus voltages) when combined with the low frequency audio signal.

The power stage 16 includes two switching devices 20, 22. The output of the gate driver 18 is coupled to the two switching devices in a push-pull or totem-pole arrangement. In the circuit illustrated in FIG. 1, the switches are field effect transistors (FET) 20, 22. In the figure, the upper FET 22 is driven by the signal output by the driver 18 and the lower FET 20 is driven by the level shifted and inverted version of the same. The two switches 20, 22 are arranged so as to be either fully on or fully off such that the output of the switching devices is at either +Vcc or −Vcc (i.e. the bus voltages). This type of arrangement utilises the property that if the push-pull output devices are either fully on or fully off they dissipate their minimum power leading to high amplifier efficiency. The output of the power stage 16 (i.e. the output from the switching stage of the amplifier) is fed back to the error amplifier, as is described above.

The output of the power stage 16 is low pass filtered using a passive filter 24 to filter out the switching frequency to allow a loudspeaker load 30 of the amplifier 2 to only see the audio signal. The standard and commonly used filter for the passive filter 24 is a two-pole inductor-capacitor (LC) filter. The commonly used component values for the passive filter 24 are a series inductor 26 of 20 pH and a capacitor 28 of 470 nF shunted to ground.

The example described in association with FIG. 1 is an audio example, but it will be appreciated that the error amplifier may be used in conjunction with other applications such as a rotational or torque producing motor and light emitting diodes.

The signal path of the PWM power, output stage may cause excess phase shift, due to timing of logic gates and temperature dependent circuit capacitances. This is because capacitance values are temperature dependent, and the phase shift may also be temperature dependent, which may lead to an error amplifier instability, signal degradation and potential for circuit damage. For global negative feedback to be used, the error amplifier should, in practice, be resilient to excess phase shift at the switching frequency and harmonics thereof.

These considerations are typically split into individual blocks based around a multiple feedback, Sallen-Key, or state variable, topology filter. However, an increased number of blocks increases circuit complexity which itself may result in excess phase shift and reduced performance. When reducing circuit blocks, the choice of operational amplifier and the high-frequency used should be taken into account, since significant gain-bandwidth product (GBP) is required within the error amplifier circuitry to avoid uncontrolled behaviour (e.g. output latch up at the power supply rail, oscillation, lack of rejection of switching frequency by not providing intended filtering function, higher signal distortion than specified by the operational amplifier part).

Therefore, there is a need to provide a simplified error amplifier taking into account the above considerations.

BRIEF DESCRIPTION OF THE DRAWINGS

The present disclosure can be understood with reference to the description of the embodiments set out below, in conjunction with the appended drawings in which.

DESCRIPTION

Figure 1:
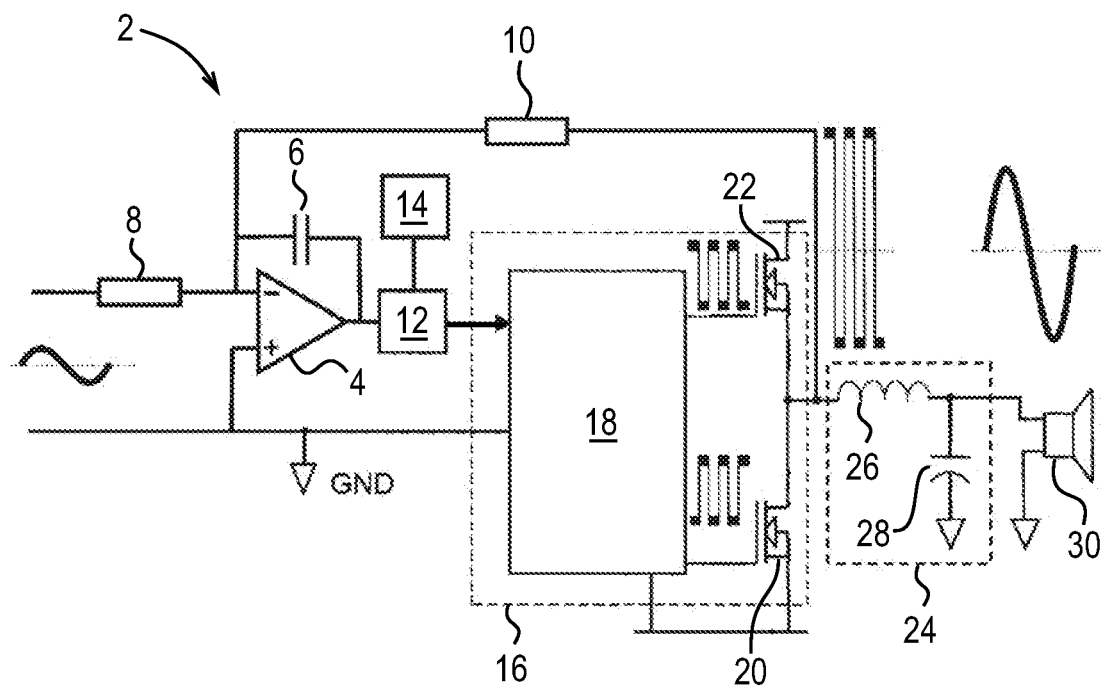
FIG. 1, described above, illustrates an example of an audio pulse width modulation (PWM) amplifier.

According to a first embodiment of the invention there is provided an error amplifier for a pulse width modulation circuit, comprising an operational amplifier configured as an integrator, and a feedback loop coupled between a signal output of the operational amplifier and an inverting input of the operational amplifier, the feedback loop comprising a feedback capacitor coupled to the signal output, a feedback resistor coupled to the feedback capacitor, and an integrator resistor coupled to the feedback resistor and the inverting input of the operational amplifier, wherein a junction between the feedback resistor and the integrator resistor is configured to receive an input signal and a junction between the feedback capacitor and the feedback resistor is configured to receive a feedback signal from the pulse width modulation circuit. Thus, an error amplifier is provided with a single stage of circuitry which takes account of the design requirements discussed above without the use of multi circuit blocks.

The feedback capacitor may be arranged to compensate for excess phase shift at the switching frequency.

The integrator resistor may be arranged to separate an integration function from a feedback summing function of the error amplifier.

The error amplifier may comprise a first low pass filter coupled to the junction between the feedback capacitor and the feedback resistor, and arranged to receive the feedback signal from the pulse width modulation circuit, wherein the first low pass filter is configured to attenuate a modulation component of the feedback signal.

The error amplifier may comprise a second low pass filter coupled to the junction between the feedback resistor and the integrator resistor and arranged to receive the input signal, wherein the second low pass filter is configured to attenuate aliasing frequency components from the input signal.

The error amplifier may comprise a shunt capacitor arranged at a signal input of the error amplifier thereby forming a pi input filter with the second low pass filter, wherein the pi input filter is configured to prevent switching energy from the feedback signal being conducted to a signal driving component. The integrator may comprise a feedforward capacitor coupled between the signal output and the inverting input of the operational amplifier.

According to a second embodiment of the invention there is provided a pulse width modulation circuit, comprising a driver circuit configured to output a modulated signal, a switching device arranged to receive the modulated signal from the driver circuit, and an error amplifier according to the first embodiment with one or more of the optional features mentioned above. An output signal of the switching device is the feedback signal and wherein the signal output of the operational amplifier is coupled to the driver circuit.

The pulse width modulation circuit may comprise two switching devices configured in a push pull arrangement.

The pulse width modulation circuit may be coupled to a loudspeaker or a motor.

An error amplifier designed to be used for PWM amplifiers typically include summation, and an integrator or a feed forward path filter, and may optionally include a feedback path filter. There are several requirements that should be considered when designing an error amplifier circuit stage, which are discussed below.

An error amplifier for use with a PWM amplifier is typically based on an operational amplifier, integrated or discrete, circuit which should include a suitably high "Gain× Bandwidth" product to operate linearly up to the maximum frequencies of interest (e.g. 400 kHz or 20 to 40 times higher than the highest audio frequency of the audio signal, switching frequency and its harmonics). The error amplifier should have a high performance within the audio signal frequency range, since the error amplifier will define the limits of signal performance of the PWM circuit. Furthermore, the power supply rails of the error amplifier should match the PWM circuit voltage switching levels or include signal conditioning to ensure a low voltage rail operational amplifier does not see voltages on its inputs which exceed its power supply rails, as this will lead to destruction of the operational amplifier and reduce reliability of circuit.

A pre-conditioning circuit block configured to filter out, or attenuate the bus voltage level PWM circuit sampling frequency from the fed-back scaled version of the modulated signal. The output voltage rail to rail switching levels are likely to exceed the power supply of the signal level voltages and power supplies of the error amplifier stage. A pre-filtering circuit block for the input audio signal to ensure the input audio signal which is fed to the PWM circuit does not contain aliasing frequency components which exceed half the sampling (i.e. switching) frequency of the PWM circuit, for example. This is because frequencies that exceed half the sampling (i.e. switching) frequency of the PWM circuit will be effectively introduced back into the input signal, causing signal distortion, and due to in-band foldback are not possible to remove.

The PWM high-voltage switching gate driver 18 and output power switching devices 20, 22 of the circuit are inserted between the output of the error amplifier and the feedback to allow high powers to be delivered to the output load (e.g. loud speaker 30).

A summing operation is required within the error amplifier to enable negative feedback to be used, since negative feedback reduces non-linearity and also reduces output impedance, as in the case with a typical feedback control circuit. For low PWM amplifier output distortion, global negative feedback can be applied to allow the error amplifier to correct for any non-linearity in the output from the PWM power output stage.

The error amplifiers presented below are configured to take account all of the requirements mentioned above. The error amplifier circuits described below have been devised as a new specialist class of filter suitable for PWM switching amplifiers, which combine the design considerations discussed above into a single stage of circuitry. This configuration offers improved circuit performance using a single operational amplifier stage. Furthermore, when the resistance values are optimised the configuration provides an inherent reliability against overvoltage conditions applied to the error amplifier terminals.

Figure 2:
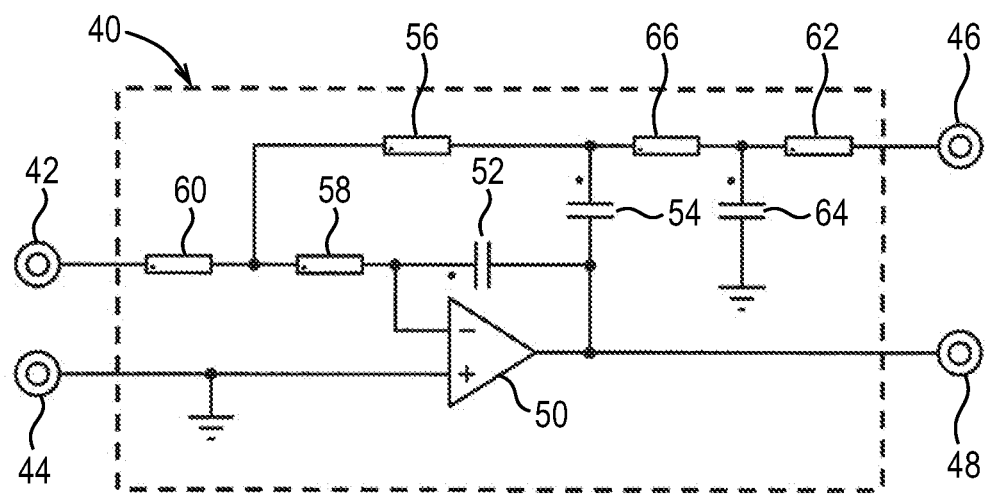
FIG. 2 illustrates an error amplifier according to a first aspect of the invention.

FIG. 2 illustrates an error amplifier 40 according to a first aspect of the invention. The amplifier 40 is fed an input audio signal at terminal or junction 42, and generates an output audio signal at terminal or junction 48. Terminal or junction 44 is connected to ground. Terminal or junction 46 is coupled to an output of a power stage of a PWM amplifier.

The error amplifier 40 includes an operational amplifier 50 selected for desired bandwidth and signal distortion characteristics, for example a AD8651, which is coupled to the same bus voltage supplies lines (i.e. +Vcc and −Vcc) as the switching stage of a PWM amplifier (not shown). The op-amp 50 is configured as an integrator with a feed-forward capacitor 52 coupled between a signal output of the op-amp 50 and an inverting input of the op-amp 50, and an integrator resistor 58. The amplifier also includes a feedback loop coupled between the signal output of the operational amplifier 50 and the inverting input of the operational amplifier 50. The feedback loop includes a feedback capacitor 54 coupled to the signal output of the op-amp 50, a first feedback resistor 56 coupled to the feedback capacitor 54 and the integrator resistor 58. The integrator resistor 58 is typically greater than or equal to 100 ohms and separates the integration function of the op-amp arrangement from the feedback summing function of the op-amp arrangement, and provides a pole multiplication of the integrator frequency.

The audio signal is fed to the error amplifier 40 via input resistor 60. The input resister 60 is coupled to the integrator resistor 58 and the first feedback resistor 56. That is to say that the input resistor 60 is coupled to a junction or terminal of/between the integrator resistor 58 and the first feedback resistor 56. A signal is fed back from the switching stage of the PMW amplifier via a second feedback resistor 66.

A low pass filter is arranged at the feedback input 46 of the error amplifier. The low pass filter includes a third feedback resistor 62 and a low-pass capacitor 64 shunted to ground. The low-pass capacitor 64 is tuned to the −3 dB frequency of the circuit, typically in the region of $F_{switching}/10$ allowing for loop reduction to minimise aliasing.

The low-pass capacitor 64 can be selected according the following expression:

$$C_{Low\text{-}pass\ capacitor\ 64} = 1/(2\pi * R_{Third\ feedback\ resistor\ 62} * F)$$

where F is the −3 dB frequency of the circuit.

The low-pass capacitor 64 has a dual function, additionally to providing loop gain reduction this capacitor also provides an open-loop zero allowing phase shift correction of the switching signal output by the PWM power, output stage of the amplifier. A design assessment should be made to prioritise function between low-pass capacitor 64 acting as a switching frequency filter giving 20 dB of rejection pre-conditioning the switching frequency present in the feedback signal and a phase correction contribution to the feedback signal presented to the error amplifier input terminal.

Increasing the value of capacitor 64 from the value calculated for −3 dB frequency=fs/10, increases the phase advance of the fed-back signal.

The gain of the error amplifier 40 is determined using the following expression:

$$AV = -((R_{First\ feedback\ resistor\ 56} + R_{Second\ feedback\ resistor\ 66} + R_{Third\ feedback\ resistor\ 62})/R_{Input\ resister\ 60}).$$

The feed forward or integrator capacitor 52 is selected according to the following expression:

$$C_{Feed\ forward\ capacitor\ 52} = 1/(((AV * R_{Integrator\ resistor\ 58}) + R_{First\ feedback\ resistor\ 56} + R_{Second\ feedback\ resistor\ 66} + R_{Third\ feedback\ resistor\ 62}) * 2\pi * F_{Integrator})$$

where $F_{Integrator} = F_{switching}/a_x$. For an audio application having a maximum frequency of 20 kHz and switching frequency ($F_{switching}$) of 400 kHz, $a_x = 3\pi$ provides an optimal filter shape and roll off.

The feedback capacitor 54 is added to provide a local compensation for any excess phase shift at the switching frequency and multiples thereof. This may improve the stability and reduce the effect of phase shift which may result from the PWM power, output stage of the amplifier. The feedback capacitor 54 effectively adds a pole and a zero in the closed loop frequency response of the error amplifier.

The following expression can be used to determine the capacitance value of the feedback capacitor 54 according the frequency of a desired pole position:

$$C_{Feedback\ capacitor\ 54} = 1/(2\pi * (R_{Second\ feedback\ resistor\ 66} + R_{Third\ feedback\ resistor\ 62}) * F_{Pole})$$

where $F_{Pole} = F_{Switching}/b_x$.

The following expression can be used to determine the zero frequency provided by the capacitance value of the feedback capacitor 54:

$$F_{Zero} = 1/(2\pi * R_{First\ feedback\ resistor\ 56} * C_{Feedback\ capacitor\ 54})$$

The gain of the error amplifier at the switching frequency should be preferably limited to approximately 6 dB. For an audio application having a maximum frequency of 20 kHz and switching frequency ($F_{switching}$) of 400 kHz, $b_x = 2\pi$ provides an optimal filter shape and roll off. The feedback capacitor 54 reduces the requirement of the "Gain×Bandwidth" product of the error amplifier circuitry at the switching frequency without affecting linearity in the range of signal frequencies.

The expressions discussed above provide i) a greater than 20 dB gain reduction at the switching frequency, and ii) flat passband response up to 20 kHz with minimal phase shift at 20 kHz (i.e. audio the upper limit of the signal frequency range). Optimisation of the component values of the error amplifier can provide a desired error amplifier gain and phase characteristics depending on the application.

In an example, a gain (AV) of 10.4 was selected and the following component values were selected:

$$R_{Input\ resister\ 60} = 1,000R;$$

$$R_{Integrator\ resistor\ 58} = 100R;$$

$$R_{First\ feedback\ resistor\ 56} = 1,000R;$$

$$R_{Second\ feedback\ resistor\ 66} = 4,700R;$$

$$R_{Third\ feedback\ resistor\ 62} = 4,700R;$$

$$F_{Switching} = 400,000\ Hz:$$

Based on the expressions provided above, and an integrator frequency of 42,441 Hz (i.e. $F_{Integrator} = 400,000/3\pi$) the following capacitor values can be determined:

$$C_{Low\text{-}pass\ capacitor\ 64} = 1/(2\pi/4,700R * 400,000\ Hz) = 847\ pF$$

$$C_{Feed\ forward\ capacitor\ 52} = 1/(((10.4*100R) + 1,000R + 4,700R + 4,700R) * 2\pi * 42,441\ Hz) = 327\ pF$$

$$C_{Feedback\ capacitor\ 54} = 1/((4,700R + 4,700R) * 400,000\ Hz) = 266\ pF$$

It will be appreciated that capacitors close to the theoretical values will be used.

Figure 3:
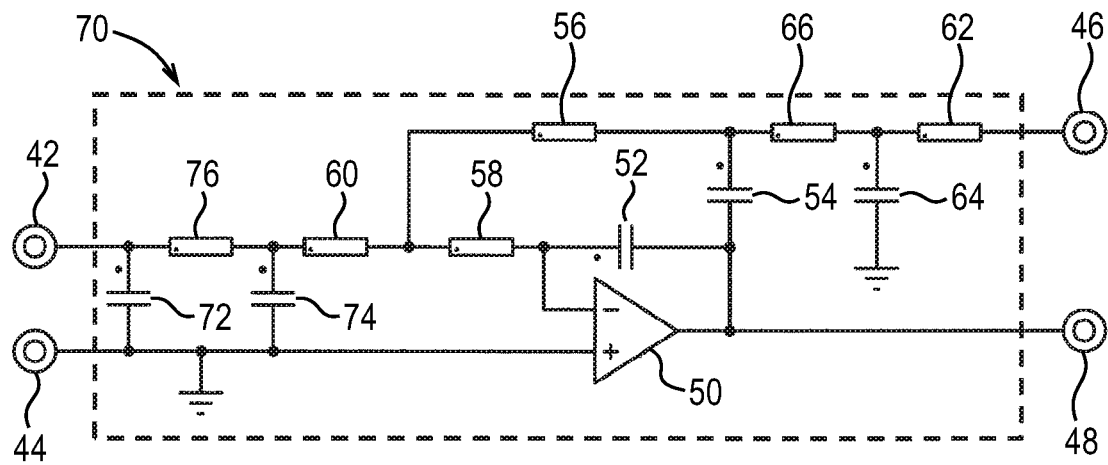
FIG. 3 illustrates an error amplifier according to a second aspect of the invention.

FIG. 3 illustrates an error amplifier 70 according to a second aspect of the invention. The components and features described in association with FIG. 2 are labelled using the same reference numerals in FIG. 3. The error amplifier 70 illustrated in FIG. 3 includes a π input filter at its input. In the figure the π input filter is fed by the audio input signal at terminal 42 and is coupled to the input resistor 60. The π input filter includes a first shunt capacitor 72 and a second shunt capacitor 74 which are separated by a second, series resistor 76. The addition of the π input filter may protect the PWM amplifier from aliasing frequency components presented to the input of the error amplifier. It is noted that the combination of the second, series resistor 76 and the input resistor 60 in FIG. 3 is equivalent to the single input resistor 60 in FIG. 2. An inductor may also be included in series with terminal 42 or in series with series resistor 76 to improve rejection. Furthermore, the first shunt capacitor 72 is optionally included, such that a low pass filter would be formed in its absence.

Figure 4:
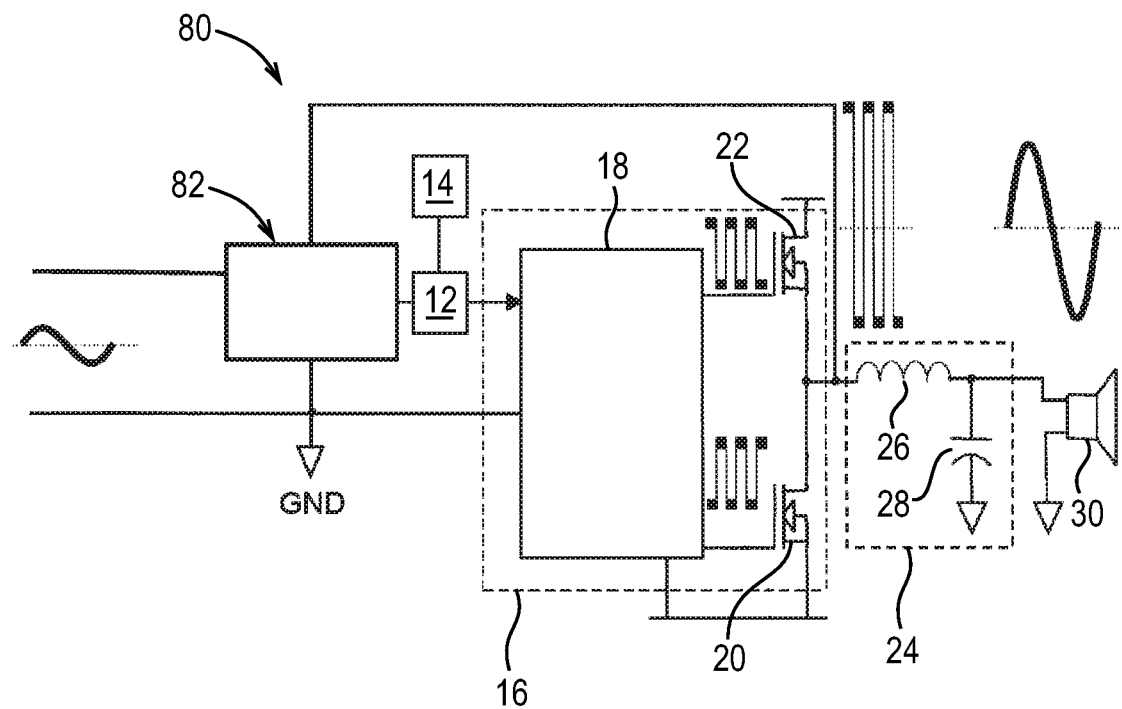
FIG. 4 illustrates an audio pulse width modulation (PWM) amplifier according to a third aspect of the invention.

FIG. 4 illustrates an audio pulse width modulation (PWM) amplifier 80 according to a third aspect of the invention. The amplifier 80 includes an error amplifier 82 which may be either the error amplifier 40 described in association with FIG. 2 or the error amplifier 70 described in association with FIG. 3. The other numbered components of FIG. 4 are the same as the like numbered features illustrated in FIG. 1. In the amplifier 80, an input audio signal is received at terminal or junction 42, and terminal or junction 48 is coupled to the gate driver 18 via the comparator 12. The output of the switches 20, 22 is coupled to terminal or junction 46 of the error amplifier 82.

Figure 5:
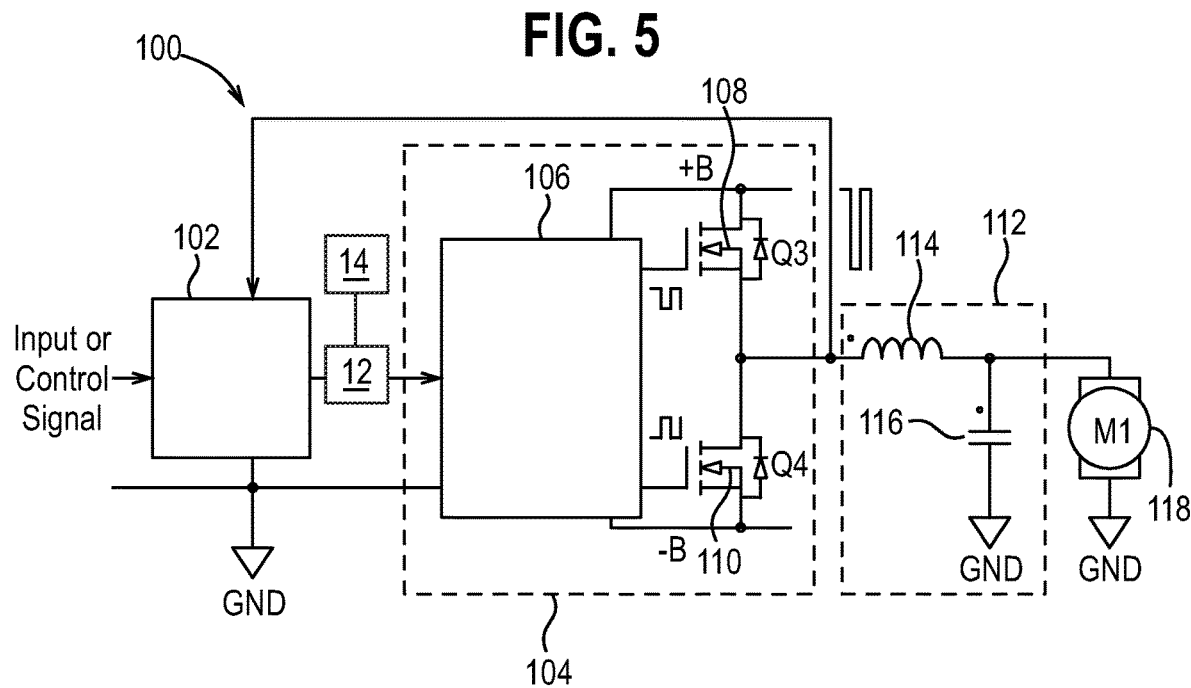
FIG. 5 illustrates a DC or AC motor control circuit according to a fourth aspect of the invention.

FIG. 5 illustrates a DC or AC motor control circuit 100 according to a fourth aspect of the invention. The circuit 100 includes an error amplifier 102 which may be of the form of the error amplifier 40 described in association with FIG. 2 or the error amplifier 70 described in association with FIG. 3. Each of error amplifier 40 and error amplifier 70 have been described in association with an audio amplifier, but the form of these amplifiers can be used as part of a DC or AC motor control circuit and it would be apparent to the skilled person how to select the appropriate component values based on the general description of those error amplifiers. The output of the error amplifier 102 is fed via the comparator 12 to a power stage 104, which includes a gate driver or switching controller 106 which outputs a signal comprising square pulses of fixed amplitude with a varying width and separation. It will be appreciated that the gate driver 106 generates a signal and a level shifted and inverted version of the same separated by a protective delay or dead time. The power stage 104 includes two switching devices 108, 110 (e.g. field effect transistors (FET)). The two switches 108, 110 are arranged so as to be either fully on or fully off such that the output of the switching devices is at either +Vcc or −Vcc (i.e. the bus voltages). This type of arrangement utilises the property that if the push-pull output devices are either fully on or fully off they dissipate their minimum power leading to high amplifier efficiency. The output of the power stage 104 is fed back to the error amplifier 102, as is described above in respect of the audio amplifier.

The output of the power stage 104 is low pass filtered using a passive filter 112 to filter out the switching frequency and is then fed to a motor 118. The passive filter 112 is a two-pole inductor-capacitor (LC) filter including a series inductor 114 and a capacitor 116 shunted to ground. The component values for the series inductor 114 and the shunt capacitor 116 can be determined using the expression $-F_{-3 dB}=1/2\pi*\sqrt{(L_{Series}*C_{Shunt})}$, where L Series is the inductance of series inductor 114 and C shunt is the capacitance of shunt capacitor 116, and $F_{-3 dB}$ is typically a division of between 2 and 10 of the switching frequency.

Figure 6:
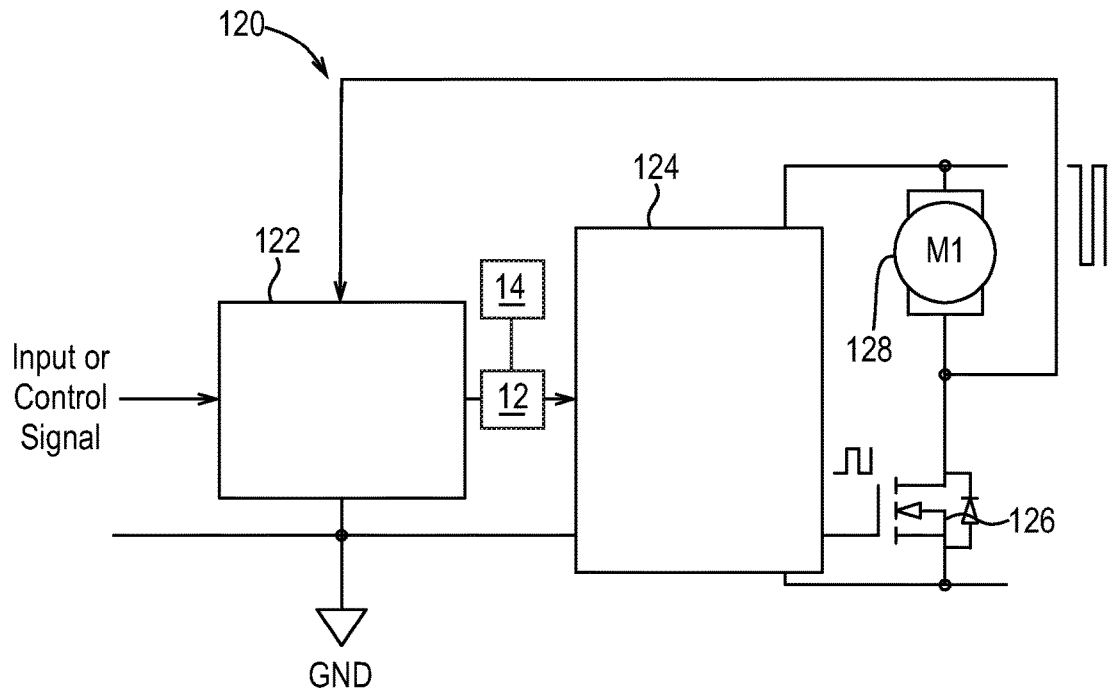
FIG. 6 illustrates a DC or AC motor control circuit according to a fifth aspect of the invention.

FIG. 6 illustrates an alternative DC or AC motor control circuit 120 according to a fifth aspect of the invention. The circuit 120 includes an error amplifier 122 which is of the form of error amplifier 102 described in association with FIG. 5. The output of the error amplifier 122 is fed to a gate driver or switching controller 124 which outputs a signal comprising square pulses of fixed amplitude with a varying width and separation. In this example, a single switch 126 (e.g. field effect transistors (FET)) is used in series with a motor 128, which are arranged between voltage supplies (i.e. +Vcc or −Vcc), and the output signal of the controller 124 is fed to the control input (i.e. gate) of the switch 126.

It will be appreciated that the foregoing discussion relates to particular embodiments. However, in other embodiments, various aspects and examples may be combined.

The invention claimed is:

1. An error amplifier for a pulse width modulation circuit, comprising:
an operational amplifier configured as an integrator; and
a feedback loop coupled between a signal output of the operational amplifier and an inverting input of the operational amplifier, the feedback loop comprising a feedback capacitor coupled to the signal output, a feedback resistor coupled to the feedback capacitor, and an integrator resistor coupled to the feedback resistor and the inverting input of the operational amplifier,
wherein a junction between the feedback resistor and the integrator resistor is configured to receive an input signal and a junction between the feedback capacitor and the feedback resistor is configured to receive a feedback signal from the pulse width modulation circuit,
wherein the integrator comprises a feedforward capacitor coupled between the signal output and the inverting input of the operational amplifier.

2. The error amplifier of claim 1, wherein the feedback capacitor is arranged to compensate for excess phase shift at the switching frequency.

3. The error amplifier of claim 1, wherein the integrator resistor is arranged to separate an integration function from a feedback summing function of the error amplifier.

4. The error amplifier of claim 1, comprising a first low pass filter coupled to the junction between the feedback capacitor and the feedback resistor, and arranged to receive the feedback signal from the pulse width modulation circuit, wherein the first low pass filter is configured to attenuate a modulation component of the feedback signal.

5. The error amplifier of claim 4, comprising a second low pass filter coupled to the junction between the feedback resistor and the integrator resistor and arranged to receive the input signal, wherein the second low pass filter is configured to attenuate aliasing frequency components from the input signal.

6. The error amplifier of claim 5, comprising a shunt capacitor arranged at a signal input of the error amplifier thereby forming a pi input filter with the second low pass filter, wherein the pi input filter is configured to prevent switching energy from the feedback signal being conducted to a signal driving component.

7. A pulse width modulation circuit, comprising:
a driver circuit configured to output a modulated signal;
a switching device arranged to receive the modulated signal from the driver circuit; and
an error amplifier according to claim 1, wherein an output signal of the switching device is the feedback signal and wherein the signal output of the operational amplifier is coupled to the driver circuit.

8. The pulse width modulation circuit of claim 7, comprising two switching devices configured in a push pull arrangement.

9. The error amplifier of claim 2, wherein the integrator resistor is arranged to separate an integration function from a feedback summing function of the error amplifier.

10. The error amplifier of claim 2, comprising a first low pass filter coupled to the junction between the feedback capacitor and the feedback resistor, and arranged to receive the feedback signal from the pulse width modulation circuit, wherein the first low pass filter is configured to attenuate a modulation component of the feedback signal.

11. The error amplifier of claim 3, comprising a first low pass filter coupled to the junction between the feedback capacitor and the feedback resistor, and arranged to receive the feedback signal from the pulse width modulation circuit, wherein the first low pass filter is configured to attenuate a modulation component of the feedback signal.

12. The error amplifier of claim 1, comprising a low pass filter coupled to the junction between the feedback resistor and the integrator resistor and arranged to receive the input signal, wherein the low pass filter is configured to attenuate aliasing frequency components from the input signal.

13. The error amplifier of claim 2, comprising a low pass filter coupled to the junction between the feedback resistor and the integrator resistor and arranged to receive the input signal, wherein the low pass filter is configured to attenuate aliasing frequency components from the input signal.

14. The error amplifier of claim 3, comprising a low pass filter coupled to the junction between the feedback resistor and the integrator resistor and arranged to receive the input signal, wherein the low pass filter is configured to attenuate aliasing frequency components from the input signal.

15. An error amplifier for a pulse width modulation circuit, comprising:
- an operational amplifier configured as an integrator;
- a feedback loop coupled between a signal output of the operational amplifier and an inverting input of the operational amplifier, the feedback loop comprising a feedback capacitor coupled to the signal output, a feedback resistor coupled to the feedback capacitor, and an integrator resistor coupled to the feedback resistor and the inverting input of the operational amplifier, wherein a junction between the feedback resistor and the integrator resistor is configured to receive an input signal, and wherein a junction between the feedback capacitor and the feedback resistor is configured to receive a feedback signal from the pulse width modulation circuit;
- a first low pass filter coupled to the junction between the feedback capacitor and the feedback resistor, and arranged to receive the feedback signal from the pulse width modulation circuit, wherein the first low pass filter is configured to attenuate a modulation component of the feedback signal;
- a second low pass filter coupled to the junction between the feedback resistor and the integrator resistor, and arranged to receive the input signal, wherein the second low pass filter is configured to attenuate aliasing frequency components from the input signal; and
- a shunt capacitor arranged at a signal input of the error amplifier thereby forming a pi input filter with the second low pass filter, wherein the pi input filter is configured to prevent switching energy from the feedback signal being conducted to a signal driving component.

* * * * *